(12) United States Patent
Shin et al.

(10) Patent No.: US 11,557,599 B2
(45) Date of Patent: Jan. 17, 2023

(54) NONVOLATILE MEMORY DEVICE

(71) Applicant: SAMSUNG ELECTRONICS CO., LTD., Suwon-si (KR)

(72) Inventors: Dongha Shin, Hwaseong-si (KR); Yohan Lee, Incheon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 276 days.

(21) Appl. No.: 16/911,299

(22) Filed: Jun. 24, 2020

(65) Prior Publication Data

US 2021/0175243 A1 Jun. 10, 2021

(30) Foreign Application Priority Data

Dec. 4, 2019 (KR) .................. 10-2019-0160128

(51) Int. Cl.
| | |
|---|---|
| *H01L 27/11582* | (2017.01) |
| *H01L 27/11573* | (2017.01) |
| *H01L 27/11524* | (2017.01) |
| *H01L 27/11556* | (2017.01) |
| *H01L 27/11529* | (2017.01) |
| *G11C 16/08* | (2006.01) |
| *H01L 23/522* | (2006.01) |
| *H01L 23/528* | (2006.01) |
| *G11C 16/04* | (2006.01) |
| *H01L 27/1157* | (2017.01) |

(52) U.S. Cl.
CPC .... *H01L 27/11573* (2013.01); *G11C 16/0483* (2013.01); *G11C 16/08* (2013.01); *H01L 23/5226* (2013.01); *H01L 23/5283* (2013.01); *H01L 27/1157* (2013.01); *H01L 27/11524* (2013.01); *H01L 27/11529* (2013.01); *H01L 27/11556* (2013.01); *H01L 27/11582* (2013.01)

(58) Field of Classification Search
CPC ................................. H01L 27/11582
See application file for complete search history.

(56) References Cited

U.S. PATENT DOCUMENTS

| | | | |
|---|---|---|---|
| 7,679,133 | B2 | 3/2010 | Son et al. |
| 7,948,797 | B2 | 5/2011 | Suzuki et al. |
| 8,553,466 | B2 | 10/2013 | Han et al. |
| 8,559,235 | B2 | 10/2013 | Yoon et al. |
| 8,654,587 | B2 | 2/2014 | Yoon et al. |
| 9,123,420 | B2 | 9/2015 | Rabkin et al. |
| 9,418,742 | B2 | 8/2016 | Shinozaki et al. |

(Continued)

OTHER PUBLICATIONS

Ralf Symanczyk et al., "Conductive Bridging Memory Development from Single Cells to 2Mbit Memory Arrays", 2007 IEEE, pp. 71-75.

*Primary Examiner* — Christopher A Johnson
(74) *Attorney, Agent, or Firm* — Volentine, Whitt & Francos, PLLC

(57) ABSTRACT

A nonvolatile memory device includes; a memory cell area including a cell structure and a common source plate. The memory cell area is mounted on a peripheral circuit area including a buried area covered by the memory cell area and an exposed area uncovered by the memory cell area. A first peripheral circuit (PC) via extending from the exposed area, and a common source (CS) via extending from the common source plate, wherein the first PC via and the CS via are connected by a CS wire disposed outside the cell structure and providing a bias voltage to the common source plate.

20 Claims, 12 Drawing Sheets

(56) References Cited

U.S. PATENT DOCUMENTS

| | | |
|---|---|---|
| 9,953,993 B2 | 4/2018 | Utsumi et al. |
| 10,020,070 B2 | 7/2018 | Choi |
| 2009/0121271 A1* | 5/2009 | Son ................... H01L 21/8221 |
| | | 257/315 |
| 2011/0233648 A1 | 9/2011 | Seol et al. |
| 2012/0051143 A1* | 3/2012 | Yoon ..................... G11C 16/06 |
| | | 365/185.22 |
| 2016/0163386 A1* | 6/2016 | Hwang ................. G11C 16/08 |
| | | 365/185.12 |
| 2019/0115361 A1 | 4/2019 | Kim et al. |
| 2019/0237472 A1 | 8/2019 | Oh et al. |
| 2019/0286323 A1 | 9/2019 | Futatsuyama |

* cited by examiner

NONVOLATILE MEMORY DEVICE

CROSS-REFERENCE TO RELATED APPLICATIONS

This application claims priority under 35 U.S.C. § 119 to Korean Patent Application No. 10-2019-0160128 filed on Dec. 4, 2019 in the Korean Intellectual Property Office, the subject matter of which is hereby incorporated by reference.

BACKGROUND

Embodiments of the inventive concept relate to semiconductor memory devices, and more particularly, to nonvolatile memory devices providing improved reliability.

Common types of nonvolatile memory include; read only memory (ROM), programmable ROM (PROM), electrically programmable ROM (EPROM), electrically erasable and programmable ROM (EEPROM), flash memory, phase-change random access memory (PRAM), magnetic RAM (MRAM), resistive RAM (RRAM), and ferroelectric RAM (FRAM).

As semiconductor manufacturing technologies have developed, continuous efforts have been made to fabricate three-dimensional (3D) memory devices. Compared with two-dimensional memory devices, 3D memory devices provide many more memory cells per unit of lateral chip area. However 3D nonvolatile memory devices are more difficult to design and fabricate and often suffer from unique challenges in suppressing noise.

SUMMARY

Embodiments of the inventive concept provide nonvolatile memory devices providing improved reliability.

According to an exemplary embodiment, a nonvolatile memory device includes; a memory cell area including at least one cell structure and a common source plate, a peripheral circuit area on which the memory cell area is mounted, including a buried area covered by the memory cell area and a first exposed area uncovered by the memory cell area, a first peripheral circuit (PC) via extending from the first exposed area, and a first common source (CS) via extending from the common source plate, wherein the first PC via and the first CS via are connected by a first wire disposed outside the at least one cell structure that provides a bias voltage to the common source plate.

According to an exemplary embodiment, a nonvolatile memory device includes; a memory cell area including a cell structure and a common source plate, and mounted on a peripheral circuit area including a buried area covered by the memory cell area and an exposed area uncovered by the memory cell area, a first peripheral circuit (PC) via extending from the exposed area, and a common source (CS) via extending from the common source plate, wherein the first PC via and the CS via are connected by a CS wire disposed outside the cell structure and providing a bias voltage to the common source plate.

According to an exemplary embodiment, a nonvolatile memory device includes; a memory cell array including a plurality of cell strings disposed on a common source plate, and a peripheral circuit having an upper surface on which the memory cell array is mounted. The peripheral circuit includes; a first row decoder having a first upper surface uncovered by the memory cell array, and configured to bias the plurality of cell strings through first wires extending upward from the first upper surface, a second row decoder having a second upper surface uncovered by the memory cell array, and configured to bias the plurality of cell strings through second wires extending upward from the second upper surface, first common source switches having a third upper surface uncovered by the memory cell array, and configured to bias the common source plate through third wires extending upward from the third upper surface, and second common source switches having a fourth upper surface uncovered by the memory cell array, and configured to bias the common source plate through fourth wires extending upward from the fourth upper surface.

BRIEF DESCRIPTION OF THE DRAWINGS

The above and other objects and features of the inventive concept will become apparent by describing in detail exemplary embodiments thereof with reference to the accompanying drawings.

DETAILED DESCRIPTION

Embodiments of the inventive concept will be described in some additional detail with reference to the accompanying drawings in which like reference numbers and labels are used to denote like or similar elements and features.

Figure 1:
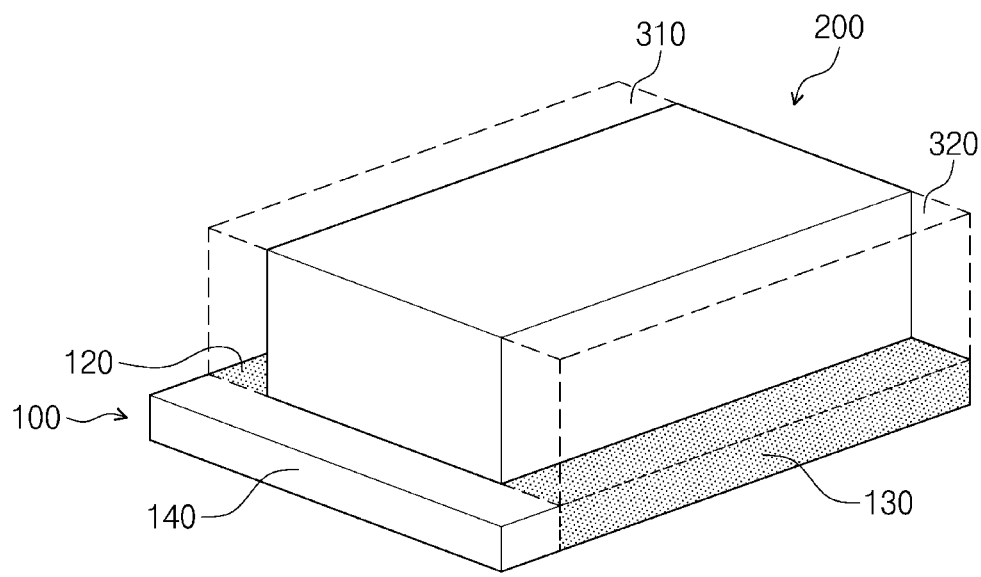
FIGS. 1, 2 and 3 are respective, perspective diagrams illustrating a nonvolatile memory device according to embodiments of the inventive concept.
Figure 1:
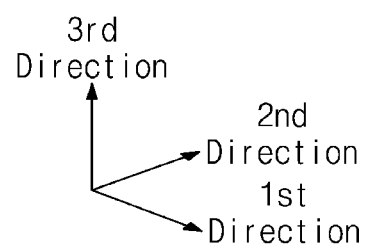

FIG. 1 is a perspective diagram illustrating a physical structure of a nonvolatile memory device 10 according to an embodiment of the inventive concept. Referring to FIG. 1, the nonvolatile memory device 10 may generally include a peripheral circuit area 100 and a memory cell area 200. Here, both the peripheral area 200 and the memory cell area 200 may have respective, lateral plate structures, wherein the memory area 200 is vertically disposed on (or over) the peripheral circuit area 100.

In this regard and throughout the following description, certain geometric terms (or descriptors) will be used to more clearly teach the making and use of embodiments of the inventive concept. Those skilled in the art will recognize that such geometric terms are relative and arbitrary in nature. For example, the term "horizontal" (or "lateral") may refer to an arrangement or orientation of elements in relation to a first direction (or an X direction) and a second direction (or a Y direction), whereas the term "vertical" (or "columnar") may refer to an arrangement or orientation of elements in a third direction (or Z direction) substantially perpendicular to a horizontal plane. Further in this regard and again assuming an arbitrary geometric orientation, certain element(s) may be described as being (or having) "upward/downward", "upper/lower", "top/bottom", "over/under", "above/beneath", "beside", "around", "facing" (or "opposing"), etc., in relation to other element(s). Here again, those skilled in the art will understand that such description is relative in nature, and usually drawn to one or more illustrated embodiments in order to clearly teach certain exemplary configurations.

Hence, with regard to the illustrated embodiment of FIG. 1, the peripheral circuit area 100 may be disposed substantially in a first horizontal plane and the memory cell area 200 may be disposed substantially in a second horizontal plane over the first horizontal plane. That is, the memory cell area 200 may be vertically mounted on an upper surface of the peripheral circuit area 100. Here, the term "mount" ("mounted" or "mounting") is used to generally denote a mechanical and/or electrical connection between two or more, vertically disposed elements. With regard to the illustrated embodiment of FIG. 1, circuits in the memory cell area 200 are mounted on circuits in the peripheral circuit area 100 to enable communication and interoperation between the respective circuits.

Figure 2:
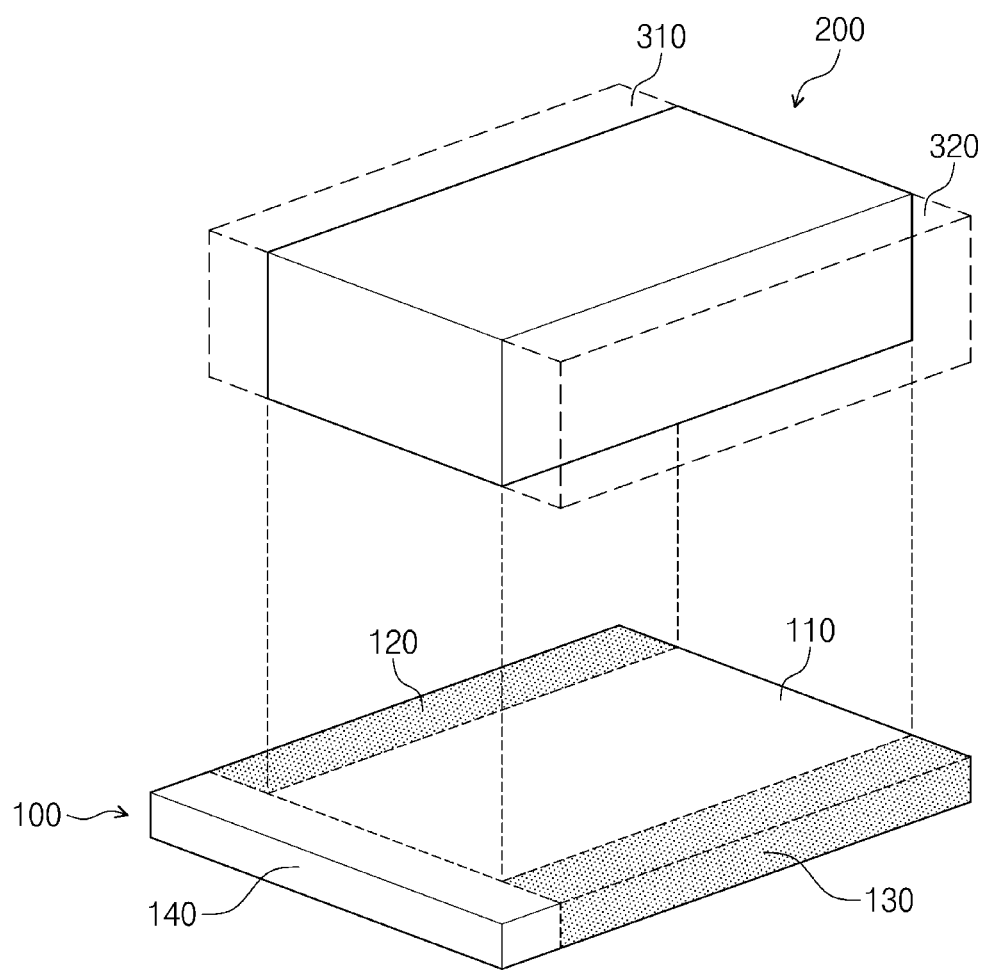

FIG. 2 is an expanded, perspective diagram further illustrating the mounting of the memory cell area 200 on the peripheral circuit area 100 of FIG. 1, wherein the memory cell area 200 occupies a smaller lateral area than the peripheral circuit area 100. Thus, as can be seen in FIGS. 1 and 2, the memory cell area 200 is centrally mounted on the peripheral circuit area 100 to define one or more buried portion(s) of the peripheral circuit area 100, and one or more exposed portion(s) of the peripheral circuit area 100. Accordingly, a centrally disposed, buried portion 110 of the peripheral area 100 may be at least partially (and laterally) surrounded by at least one exposed portion of the peripheral circuit area 100. Specific to the illustrated embodiment of FIG. 2, the buried portion 110 is partially surrounded by a first exposed area 120, a second exposed area 130 and a third exposed area 140. Here, the first exposed area 120 and the second exposed area 130 extend in the second direction, and the third exposed area 140 extends in the first direction.

In this regard, the terms "buried" and "exposed" refer to differing states of an upper surface of the peripheral circuit area 100 once the memory cell area 200 has been mounted thereon. Hence, an upper surface of the buried portion 110 may be covered by the mounted memory cell area 200, and respective upper surfaces of the exposed portions may be uncovered by the mounted memory cell area 200.

The memory cell area 200 may include a plurality of cell transistors. The plurality of cell transistors may be used as memory cells capable of storing data during the execution of write (or program) operations and retrieving stored data during the execution of read operations; dummy cell capable of storing dummy data; and/or selection transistors used to select (or not select) between the memory cells and/or the dummy memory cells during the execution of read/write operations.

A first wiring area 310 may include first wires connecting the memory cell area 200 (or any particular component of the memory cell area 200) and the peripheral circuit area 100 (or any particular component of the peripheral circuit area) and may be provided over the first exposed area 120. A second wiring area 320 may include second wires connecting the memory cell area 200 and the peripheral circuit area 100 may be provided over the second exposed area 130. Of note in this regard, the first wires and second wires may be used to variously connect components of the memory cell area 200 (e.g., a common source plate) with components of the peripheral circuit area 100 outside of (or external to) a cell structure disposed in the memory cell area 200. That is, various first and second wires need not be run through the cell structure to connect components.

In this context, it should be noted that the term "wire" as used herein broadly denotes a great variety of conductive elements having various shapes, sizes and electrically conductive properties. Hence, the term "wire" should be broadly construed to read on any electrically conductive element(s) capable of communicating an electrical signal from one element (e.g., a first via) to another element (e.g., a second via).

That is, circuitry and components in the memory cell area 200 may be at least partially, electrically connected with circuitry and components in the peripheral circuit area 100 through the first wires of the first wiring area 310 and the second wires of the second wiring area 320 disposed on opposing sides of the memory cell area 200.

The buried area 110 may include various circuits used to control the operation of the nonvolatile memory device 10. The first exposed area 120 may include circuits used to control the operation of certain cell transistors of the memory cell area 200 through the first wires, and the second exposed area 130 may include circuits used to control the operation of certain cell transistors of the memory cell area 200 through the second wires.

In contrast, the third exposure area 140 may include circuits capable of communicating (e.g., exchanging signals) with an external device, and may also include various wires and pads used to physically interface with the external device.

Figure 3:
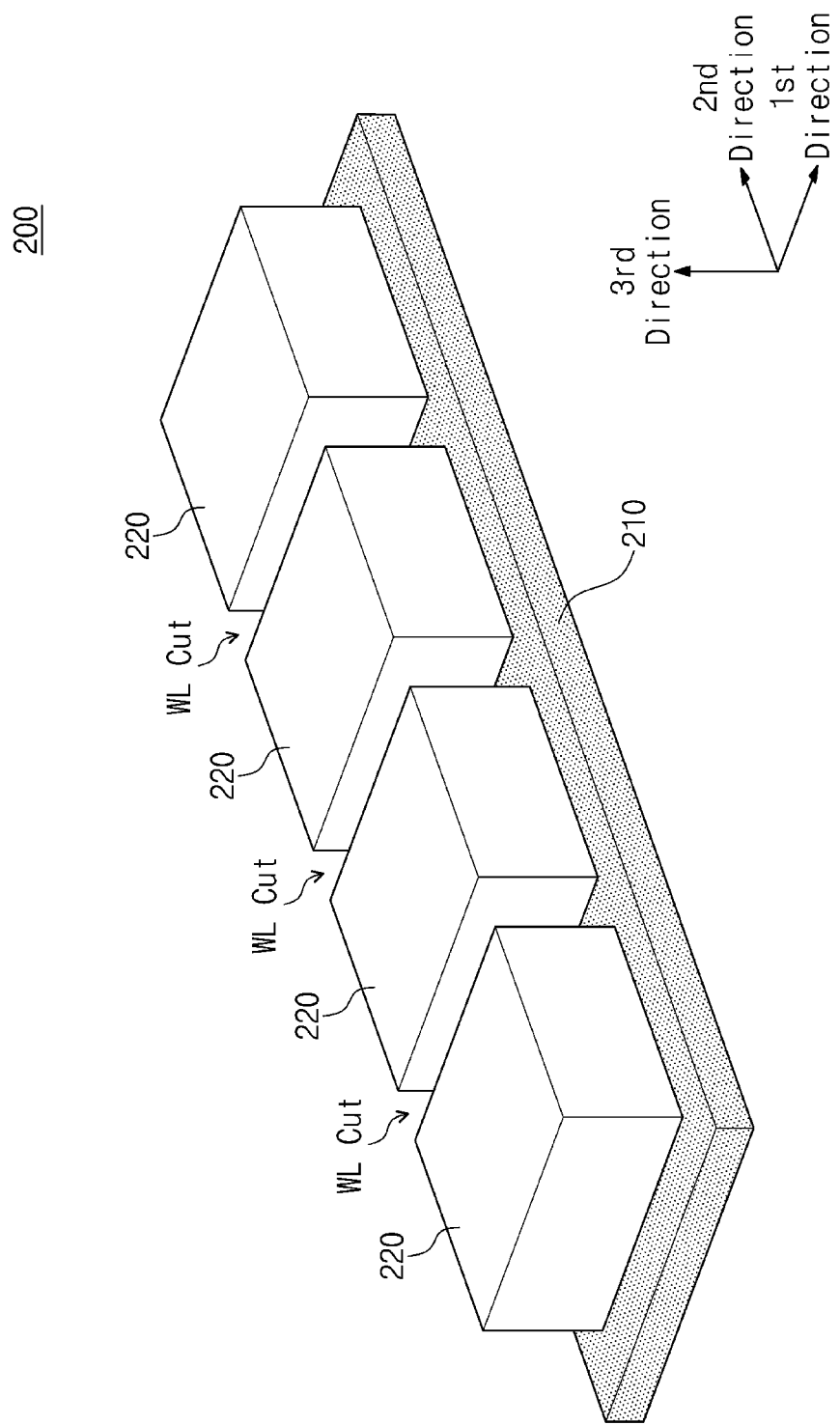

FIG. 3 is a perspective diagram illustrating one possible structure for the memory cell area 200 of FIG. 2. Referring to FIGS. 1, 2, and 3, the memory cell area 200 may include a common source plate 210 extending in a horizontal plane defined by the first direction and the second direction, and a plurality of cell structures 220 disposed on the common source plate 210, and spaced from each other in the second direction.

The common source plate 210 may be provided in common connection with respective circuitry in each one the plurality of cell structures 220. For example, the common source plate 210 may be used to transfer one or more voltage(s) to the plurality of cell structures 220. In this regard, the common source plate 210 may include silicon doped with P-type impurities and/or N-type impurities.

A space physically separating the plurality of cell structures 220 may be referred as a word line cut (or WL Cut). The plurality of cell structures 220 may have the same structure. Each of the plurality of cell structures 220 may include cell strings horizontally arranged along the first direction and the second direction, and each of the cell strings may include cell transistors vertically stacked in the third direction.

The plurality of cell structures 220 may be variously configured to provide memory block(s). That is, each memory block may be provided by one or more cell structures 220. For example, a memory block may include a set of commonly managed cell transistors, so that during the execution of read/write operations, various voltages may be simultaneously applied to cell transistors belonging to the same memory block.

Figure 4:
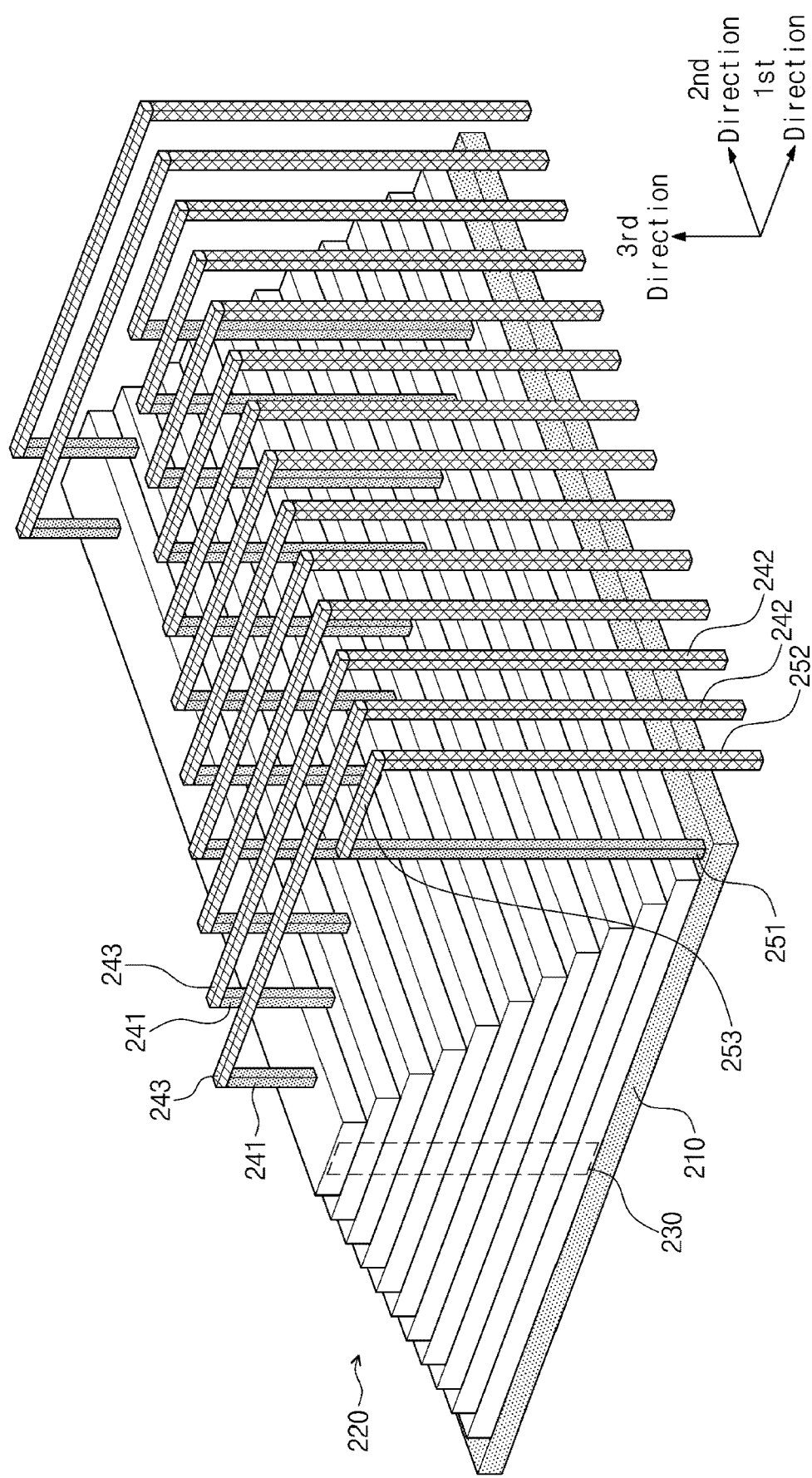
FIG. 4 is a perspective diagram further illustrating cell structure 220 of FIG. 3.

FIG. 4 is a perspective diagram illustrating one possible structure for the one cell structure 220 of FIG. 3. Referring collectively to FIGS. 1, 2, 3, and 4, a stair-stepped cell structure 220 may be disposed on the common source plate 210, wherein the stair-stepped cell structure 220 includes a plurality of vertically stacked layers. Here, each of the successively stacked layers ("stacked layers") includes an upper surface having a buried portion and laterally opposing, exposed portions resulting from the fact that each successively stacked layer occupies a smaller lateral area than the immediately underlying layer. The illustrated example of FIG. 4 shows the cell structure 220 including eleven (11) layers, but this is just one possible configuration contemplated by embodiments of the inventive concept.

The cell structure 220 may include a channel area 230. The channel area 230 may be centrally displaced in the cell structure 220 (e.g., in the first direction). The channel area 230 may extend upward to be commonly included in the vertically stacked layers of the cell structure 220. That is, in the channel area 230, cell transistors may be implemented in each of the stacked layers.

Each of the stacked layers of the cell structure 220 may be respectively connected with the peripheral circuit area 100 using one or more wires. For example, referring to FIGS. 2 and 4, one or more of the first wires of the first wiring area 310 and/or one or more of the second wires of the second exposed area 130 may be used to variously connect the peripheral circuit area 100 to one or more the stacked layers of the cell structure 220.

In order to avoid FIG. 4 from becoming unnecessarily complicated, only certain second wires are illustrated. Here, the second wires 243 may respectively connect to memory cell (MC) vias 241 (i.e., vias disposed in the memory cell area 200) with peripheral circuit (PC) vias 242 (i.e., vias disposed in the peripheral circuit area 100). The MC vias 241 may extend vertically upward from (or through) one or more of the stacked layers, and the PC vias 242 may extend vertically upward through the second wiring area 320. The MC vias 241, PC vias 242, and the second wires 243 may be variously formed from one or more conductive materials (e.g., one or more metal(s) or metal layer(s)).

In this context, phrases like "extend vertically upward", "extend from", "extending from", etc. denote relationships in which a via may be electrically connectable as it is disposed in (or as it passes through) a material layer. Hence, a via may significantly extend above an upper surface of the material layer, or it may only minimally extend from (or be exposed in) a material layer in order to be connected with another conductive element.

The second wires (and/or the first wires, not shown) may further include at least one wire connected to the common source plate 210. Hereafter, certain first and/or second wires connecting the common source plate 210 will be referred to as CS wire(s) and certain PC vias and/or MC vias will be referred to as CS via(s). In FIG. 4, at least one CS via 251 may extend vertically upward from the common source plate 210 and be connected to a PC via 252 through a CS wire 253. Here again, the conductive material(s) forming the CS wire 253 and the CS via 251 may include one or more metal(s).

It is possible to electrically bias the common source plate 210 using one or more CS via(s) (e.g., through hole via(s)) that penetrate the cell structure 220 (e.g., the channel area 230). However, one or more CS via(s) that do not penetrate the cell structure 220 may be used in certain embodiments of the inventive concept. In such cases, wherein a CS via does not penetrate the cell structure 220, the level of difficulty associated with the fabrication of nonvolatile memory devices according to embodiments of the inventive concept may be reduced.

In this regard, CS via(s) may occupy space not occupied by cell transistors. Accordingly, the placement and number of CS vias need not increase the integration density of the constituent cell transistors. As a further result of the foregoing, additional CS vias may be incorporated in nonvolatile memory devices according to embodiments of the inventive concept without fear of adversely influencing the integration density of the cell transistors. Accordingly, an increased number of CS vias provides an enhanced voltage capacity for biasing the common source plate 210.

When a ground voltage is applied to the common source plate 210 and a current flows from the channel area 230 to the common source plate 210, a phenomenon may arise in which the voltage of the common source plate 210 varies from ground due to electrical noise. However, in certain embodiments of the inventive concept, the common source plate 210 may be used to apply a relatively bias voltage without noise becoming a problem.

In certain embodiments of the inventive concept, the common source plate 210 may be used to apply a high voltage during the execution of an erase operation. In such cases, wherein the bias voltage capacity of the common source plate 210 increases, the time required to charge the bias voltage of the common source plate 210 to a desired level (e.g., a high voltage level) may be reduced.

Figure 5:
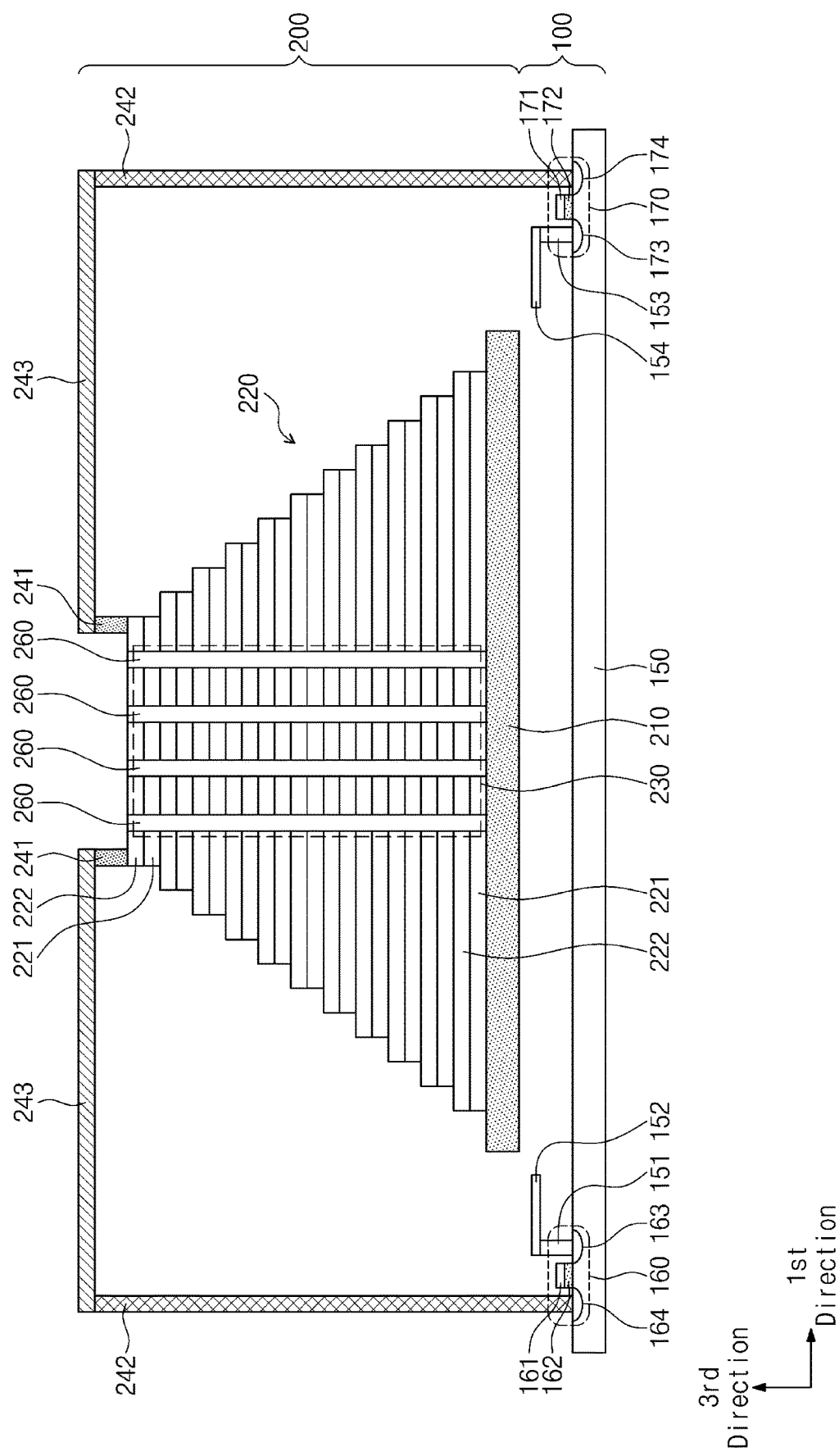
FIGS. 5, 6 and 7 are respective cross-sectional views further illustrating the peripheral circuit area and the memory cell area of FIGS. 1, 2, 3 and 4.

FIG. 5 is a cross-sectional diagram further illustrating in one example the peripheral circuit area 100 and the memory cell area 200 of a nonvolatile memory device according to an embodiment of the inventive concept. Here, the cross-sectional view of the cell structure 220 is taken along the first direction, and further illustrates wires connecting an uppermost layer of the cell structure 220 from among the first wires and the second wires.

Referring to FIGS. 1, 2, 3, 4, and 5, the peripheral circuit area 100 may include an active area 150, as well as a first connecting elements 160 and a second connection element 170 disposed on the active area 150. In certain embodiments, the active area 150 may be part of a semiconductor substrate, the first connecting element 160 may be a first transistor connecting a first PC via 242, and the second connecting element 170 may be a second transistor connecting a second PC via 242.

The first transistor 160 may include a gate 161, an insulating layer 162, a first junction 163, and a second junction 164. The second transistor 170 may include a gate 171, an insulating layer 172, a first junction 173, and a second junction 174.

The first junction 163 of the first transistor 160 may be connected with a third PC via 151. The third PC via 151 may be connected with another component in the peripheral circuit area 100 through a metal wire 152. The second junction 164 of the first transistor 160 may be connected with the PC via 242.

The first junction 173 of the second transistor 170 may be connected to a fourth PC via 153. The fourth PC via 153 may be connected with another component in the peripheral circuit area 100 through a metal wire 154. The second junction 174 of the second transistor 170 may be connected with the PC via 242.

Components directly connected with a PC via 242 from among the many components typically populating the peripheral circuit area 100 are shown in FIG. 5. However, those skilled in the art will recognize that additional components not illustrated in FIG. 5 may be present in the peripheral circuit area 100.

The memory cell area 200 may include the common source plate 210 and the cell structure 220 vertically stacked on the common source plate 210. The cell structure 220 may have a structure in which insulating layers 221 and conductive layers 222 are sequentially and vertically stacked on the common source plate 210.

Vertical channels 260 may downwardly penetrate the cell structure 220 in the channel area 230. The vertical channels 260 may be used to form cell transistors (e.g., including memory cells, dummy memory cells, and selection transistors) vertically stacked together within the cell structure 220.

The cell structure 220 may have a stair-stepped structure in which each successively stacked layer occupies a smaller horizontal footprint (e.g., has a smaller horizontal length in the first direction) than the immediately underlying layer. Certain stacked layers may be information storage layer(s) including a silicon oxide layer, a silicon nitride layer, and/or a silicon oxide layer and that are disposed between the cell structure 220 and the vertical channels 260.

The conductive layers 222 of the cell structure 220 may extend along the first direction and may be electrically connected to cell transistors. The conductive layers 222 of the cell structure 220 may be biased through one or more MC vias. That is, cell transistors in each of the conductive layers 222 may be commonly biased through one or more MC via(s).

Each of the PC vias 242 may extend upwardly from the second junction 164 or 174 of the first transistor 160 or the second transistor 170. In certain embodiments of the inventive concept, "unoccupied portion(s)" of the peripheral circuit area 100 and/or unoccupied portion(s) of the memory cell area 200 (i.e., portions not including active elements) may be filled with an insulating material. The PC vias 242 may penetrate upwardly into the insulating material of unoccupied portions of the peripheral circuit area 100 and the memory cell area 200.

When the nonvolatile memory device 10 of FIG. 1 operates, a high voltage (e.g., 10 V or higher) may be applied to the conductive layers 222. The first transistor 160 and the second transistor 170 may be respectively implemented as high-voltage transistors readily adapted to withstand high voltage. The first transistor 160 and the second transistor 170 may be referred to as "pass transistors" with respect to a high-voltage transfer. For example, twenty-four (24) pass transistors may be used to transfer voltages to eleven (11) conductive material layers. That is, 2(n+1) pass transistors may be used to transfer voltages to 'n' conductive material layers. To efficiently design pass transistors, the pass transistors may be implemented as an array disposed in the peripheral circuit area 100.

The number of pass transistors necessary for one cell structure 220 may vary depending on a structure of the cell structure 220, and the connection relationship(s) between corresponding wires, vias and other elements.

In the illustrated example of FIG. 5, the vertical channels 260 are shown in cross section, as are the MC vias 241 and PC vias 242 connected with the uppermost layer of the cell structure 220. However, in the case where a location of the vertical channels 260 is not aligned with the cross section corresponding to the MC vias 241 and the PC 242 connected with the uppermost layer of the cell structure 220, the vertical channels 260 may not be viewed, or only a part of the vertical channels 260 may be viewed.

In the illustrated examples of FIGS. 4 and 5, four (4) vertical channels 260 are shown in the channel area 230. However, this number of vertical channels is merely one possible example. Likewise, the cell structure 220 illustrated in FIG. 5 includes 11 layers, but this number is merely a selected example.

To prevent drawings from being unnecessarily complicated, components associated with the vertical channels 260 are not illustrated in FIG. 5. However, certain components typically associated with the vertical channels 260 will be described in some additional detail with reference to FIG. 7.

In the illustrated example of FIG. 5, first and second wires 243 are shown connected with the uppermost layer of the cell structure 220. However, those skilled in the art will recognize that similar connections may exist between various first and second wires 243 and other layers of the cell structure 220, as well as between the first and second wires 242 and various MC vias 241 and PC vias 242.

Figure 6:
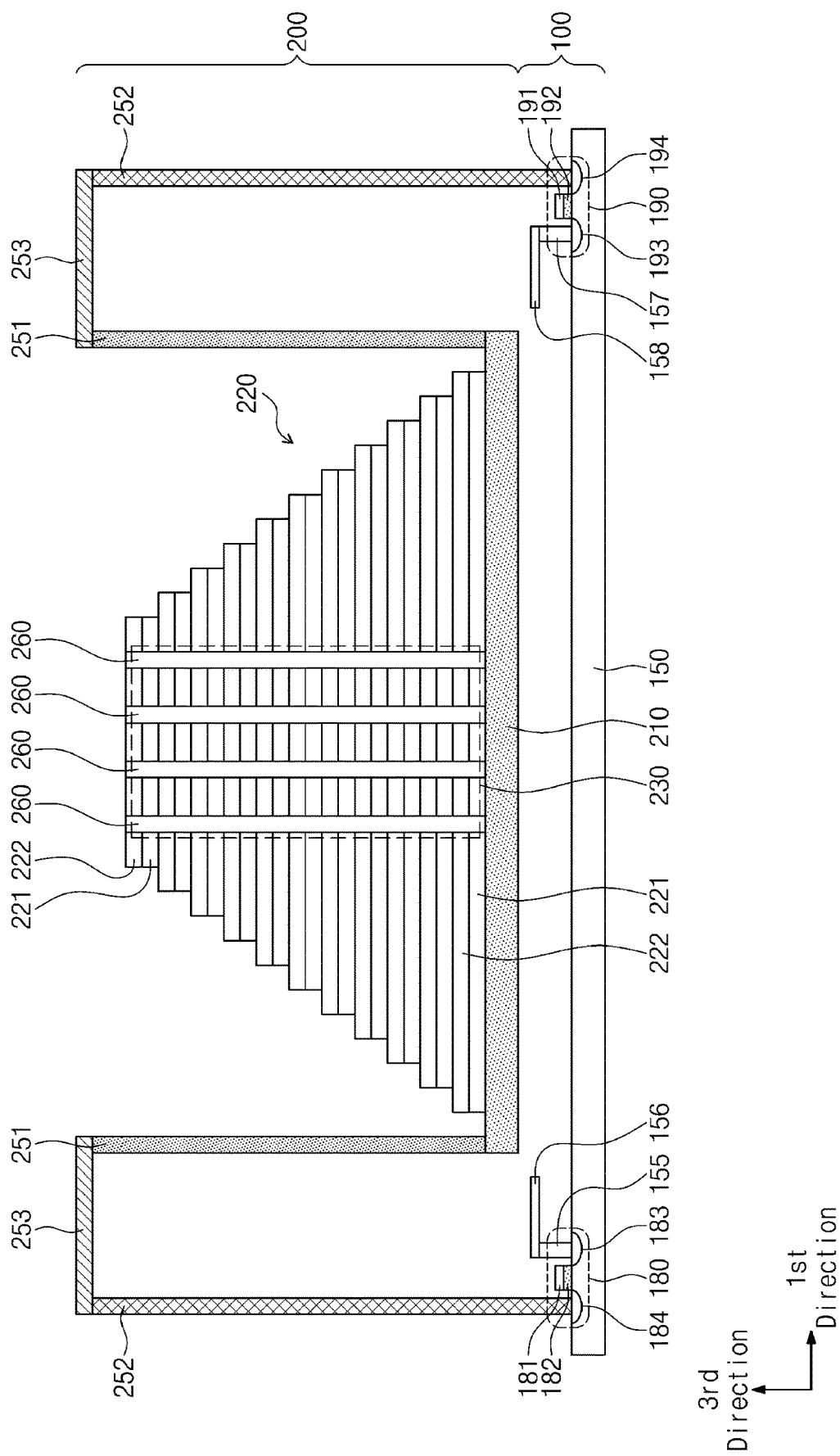

FIG. 6 is another cross-sectional view (analogous to FIG. 5) of the peripheral circuit area 100 and the memory cell area 200 of certain embodiments of the inventive concept. Here, the cross-sectional view of the cell structure 210 is taken along the first direction with regard to wires connecting the common source plate 210 from among the first wires and/or the second wires.

Referring to FIGS. 1, 2, 3, 4, and 6, the peripheral circuit area 100 may include the active area 150, as well as a third connection element 180 and a fourth connection element 190 dispose in the active area 150. The active area 150 may be a semiconductor substrate or a portion of a semiconductor substrate. The third and fourth connection elements 180 and 190 may be respective (third and fourth) transistors connected with the PC vias 252 through a first wire or a second wire.

The third transistor 180 may include a gate 181, an insulating layer 182, a first junction 183, and a second junction 184. The fourth transistor 190 may include a gate 191, an insulating layer 192, a first junction 193, and a second junction 194.

The first junction 183 of the third transistor 180 may be connected to a third PC via 155. The third PC via 155 may be connected with another component in the peripheral circuit area 100 through a metal wire 156. The second junction 184 of the third transistor 180 may be connected with the PC via 252.

The first junction 193 of the fourth transistor 190 may be connected with a fourth PC via 157. The fourth PC via 157 may be connected with another component in the peripheral circuit area 100 through a metal wire 158. The second junction 194 of the fourth transistor 190 may be connected with the PC via 252.

Here, only components directly connected with the PC vias 252 among components in the peripheral circuit area 100 are illustrated in FIG. 6. However, additional components not illustrated in FIG. 6 may be present in the peripheral circuit area 100.

The memory cell area 200 may include the common source plate 210 and the cell structure 220 on the common source plate 210. The cell structure 220 may have the same structure as described with reference to FIG. 5.

Each of the PC vias 252 may extend vertically upward from the second junction 184 or 194 of the third transistor 180 or the fourth transistor 190 through respective unoccupied portions of the peripheral circuit area 100 and/or the memory cell area 200 filled with an insulting material.

The third transistor 180 and the fourth transistor 190 may be implemented together with pass transistors and may be included in an array of pass transistors disposed in the peripheral circuit area 100. The third transistor 180 and the fourth transistor 190 may be implemented as high-voltage transistors or low-voltage transistors.

In an embodiment, the array of pass transistors including the third transistor 180 and/or the fourth transistor 190 may be variously disposed in the first exposed area 120 and/or the second exposed area 130.

As described with reference to FIGS. 6 and 7, the memory cell area 200 may be implemented over the peripheral circuit area 100 to control the memory cell area 200. This structure may be called a "cell over peri (COP)".

Figure 7:
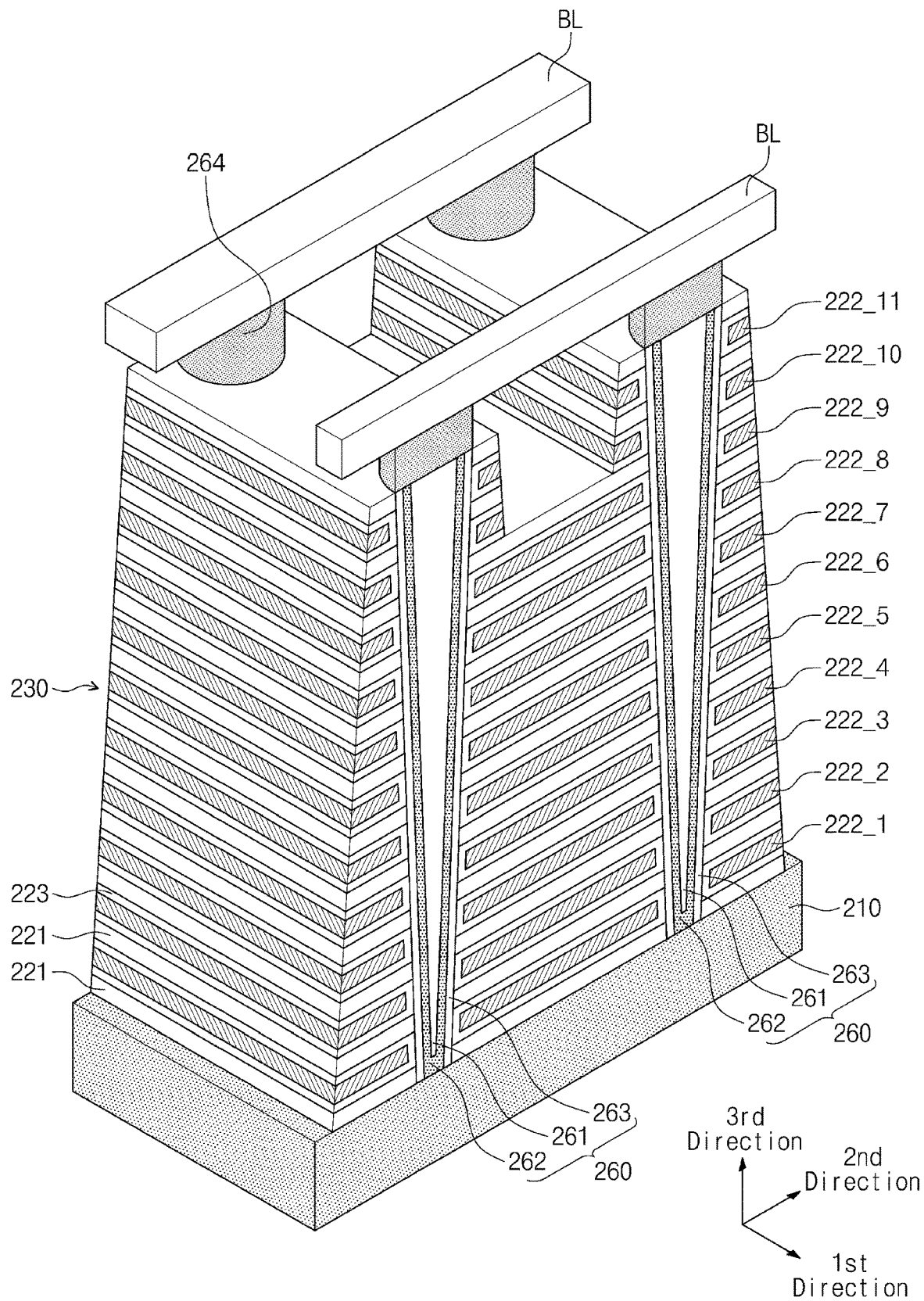

FIG. 7 is a perspective cross-sectional view of a portion of a channel area 230. Referring to FIGS. 1, 2, 3, 4, and 7, the channel area 230 of the cell structure 220 is disposed on an upper surface of the common source plate 210.

In the channel area 230, the insulating layers 221 and the conductive layers 222 are alternatingly and sequentially stacked on the common source plate 210. Here, the insulating layers 221 may include silicon oxide or silicon nitride.

Adjacent vertical channels 260 are spaced apart from one another in the second direction and penetrate downward through the insulating layers 221 and the conductive layers 222 of the channel area 230. In an embodiment, the vertical channels 260 contact the common source plate 210 through the vertical stack of alternating insulating layers 221 and conductive layers 222. Each of the vertical channels 260 may include an inner material 261, a channel layer 262, and a first insulating layer 263.

The inner material 261 may include an insulating material or an air gap. The channel layer 262 may include a P-type semiconductor material or an intrinsic semiconductor material. The first insulating layer 263 may include one or more insulating layers (e.g., different insulating layers) such as a silicon oxide layer, a silicon nitride layer, and an aluminum oxide layer.

The second insulating layers 223 are provided on upper surfaces (e.g., surfaces facing the third direction) of the conductive layers 222, lower surfaces (e.g., surfaces facing away from the third direction) of the conductive layers 222, and surfaces (e.g., surfaces facing the second direction and surfaces facing away from the second direction) of the conductive layers 222 adjacent to the channel layer 262.

In each of the vertical channels 260, the first insulating layer 263 and the second insulating layer 223 may be coupled adjacent to each other to form an information storage layer. For example, the first insulating layer 263 and the second insulating layer 223 may include oxide-nitride-oxide (ONO) or oxide-nitride-aluminum (ONA). The first insulating layer 263 and the second insulating layer 223 may form a tunneling insulating layer, a charge trap layer, and a blocking insulating layer.

The conductive layers 222 may include first to eleventh conductive layers 222_1 to 222_11. The conductive layers 222 may include a metallic conductive material. Drains 264 are provided on the vertical channels 260. In an embodiment, the drains 264 may include an N-type semiconductor material (e.g., silicon). In an embodiment, the drains 264 may be in contact with upper surfaces of the channel layers 262 of the vertical channels 260.

Bit lines (BL) that extend in the second direction, are spaced apart in the first direction, and are disposed on the drains 264. The bit lines BL are connected with the drains 264. In an embodiment, the drains 264 and the bit lines BL may be connected through contact plugs. The bit lines BL may include a metallic conductive material.

The vertical channels 260 form cell strings CS (refer to FIG. 8) together with the first and second insulating layers 263 and 223 and the conductive layers 222. Each of the vertical channels 260 form one cell string together with the first insulating layers 263, the second insulating layers 223, and adjacent conductive layers 222.

Each of the first to eleventh conductive layers 222_1 to 222_11 may form a plurality of cell transistors, which belong to one layer, together with the first insulating layers 263, the second insulating layers 223, and the channel layers 262 adjacent thereto. Each of the first to eleventh conductive layers 222_1 to 222_11 may form a wire connected in common with cell transistors. As the first to eleventh conductive layers 222_1 to 222_11 are vertically stacked in the third direction, cell transistors in each cell string may be stacked along the third direction.

The first to eleventh conductive layers 222_1 to 222_11 may extend in the first direction and be arranged in a stair-stepped structure. The bit lines BL may extend in the second direction and may be connected with the plurality of cell structures 220. The bit lines BL may be electrically connected with components of the peripheral circuit area 100 through various vias (e.g., through hole vias) that penetrate the channel area 230 or the cell structure 220.

Thus, the cell structure 220 may be provided as a 3D memory array. The 3D memory array may be monolithically formed in one or more physical levels of a circuit associated with operations of the common source plate 210 and the cell transistors. Here, the term "monolithic" means that layers of each level of the 3D array are directly deposited on the layers of each underlying level of the 3D array.

In an embodiment of the inventive concept, the 3D array includes vertical cell strings CS (or NAND strings) that are vertically oriented such that at least one memory cell is located over another memory cell. The at least one memory cell may include a charge trap layer.

In this regard, the following documents are incorporated by reference that further describe various configurations of 3D memory arrays: U.S. Pat. Nos. 7,679,133; 8,553,466; 8,654,587; 8,559,235; and published U.S. Patent Application Pub. No. 2011/0233648.

Figure 8:
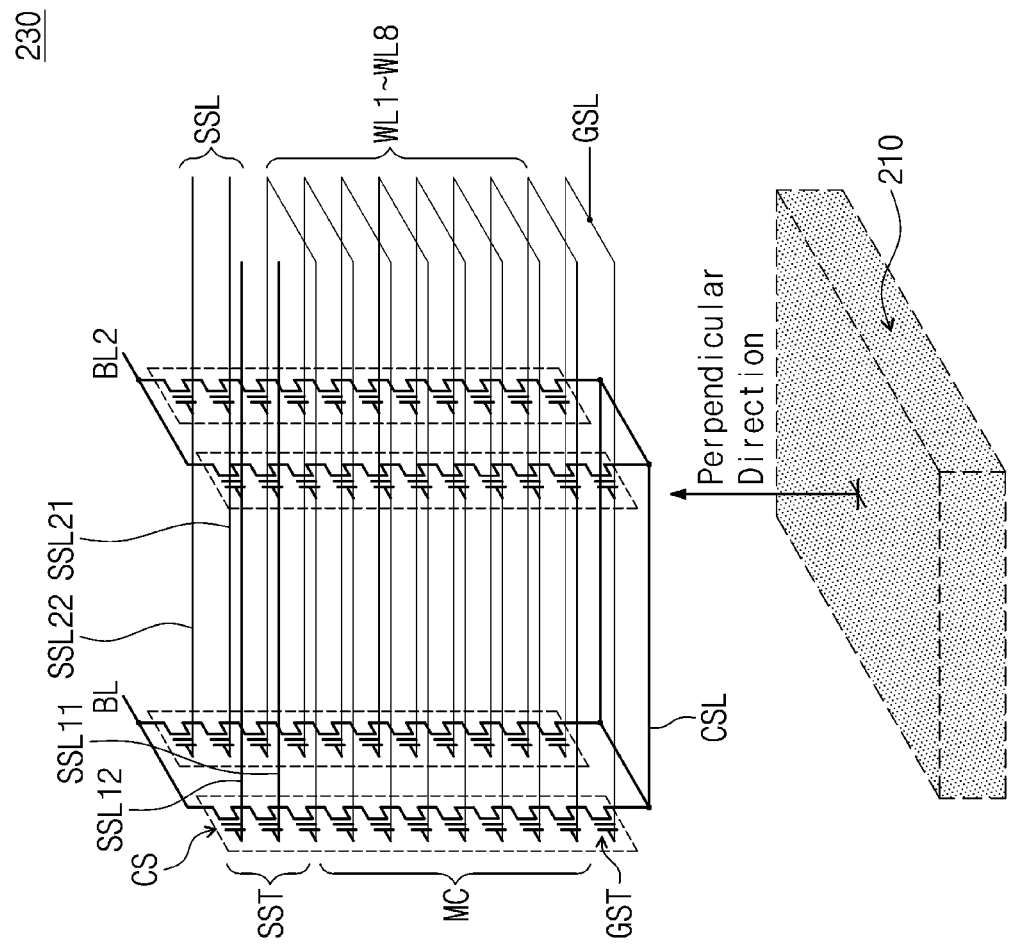
FIG. 8 is a circuit diagram further illustrating the channel area of FIG. 7.

FIG. 8 is a circuit diagram further illustrating the channel area 230 of FIG. 7. Referring to FIGS. 7 and 8, four (4) vertical channels 260 are assumed to form four (4) vertical cell strings. Cell transistors corresponding to the first conductive layer 222_1 may be used as ground selection transistor GST. The first conductive layer 222_1 may be a ground selection line GSL connected in common with the ground selection transistor GST.

Cell transistors corresponding to the second to ninth conductive layers 222_2 to 222_9 may be used as memory cells MC. The second to ninth conductive layers 222_2 to 222_9 may be used as first to eighth word lines WL1 to WL8. Each of the first to eighth word lines WL1 to WL8 may be connected in common with the memory cells MC of the corresponding layer.

Cell transistors corresponding to the tenth and eleventh conductive layers 222_10 and 222_11 may be used as string selection transistors SST. The tenth and eleventh conductive layers 222_10 and 222_11 may be used as string selection lines SSL11, SSL12, SSL21, and SSL22.

The string selection lines SSL11 and SSL21 may correspond to the tenth conductive layers 222_10, respectively. As described with reference to FIG. 4, the string selection lines SSL11 and SSL21 may be biased through different wires of the first wires and different wires of the second wires.

The string selection lines SSL12 and SSL22 may correspond to the eleventh conductive layers 222_11, respectively. As described with reference to FIG. 4, the string selection lines SSL12 and SSL22 may be biased through different wires of the first wires and different wires of the second wires.

The common source plate 210 may be used as a common source line CSL connected in common with the cell strings. The common source plate 210 may be biased by a positive high voltage in an erase operation and may be biased by a ground voltage or a positive voltage or a negative voltage having a similar level to the ground voltage in a read operation.

Figure 9:
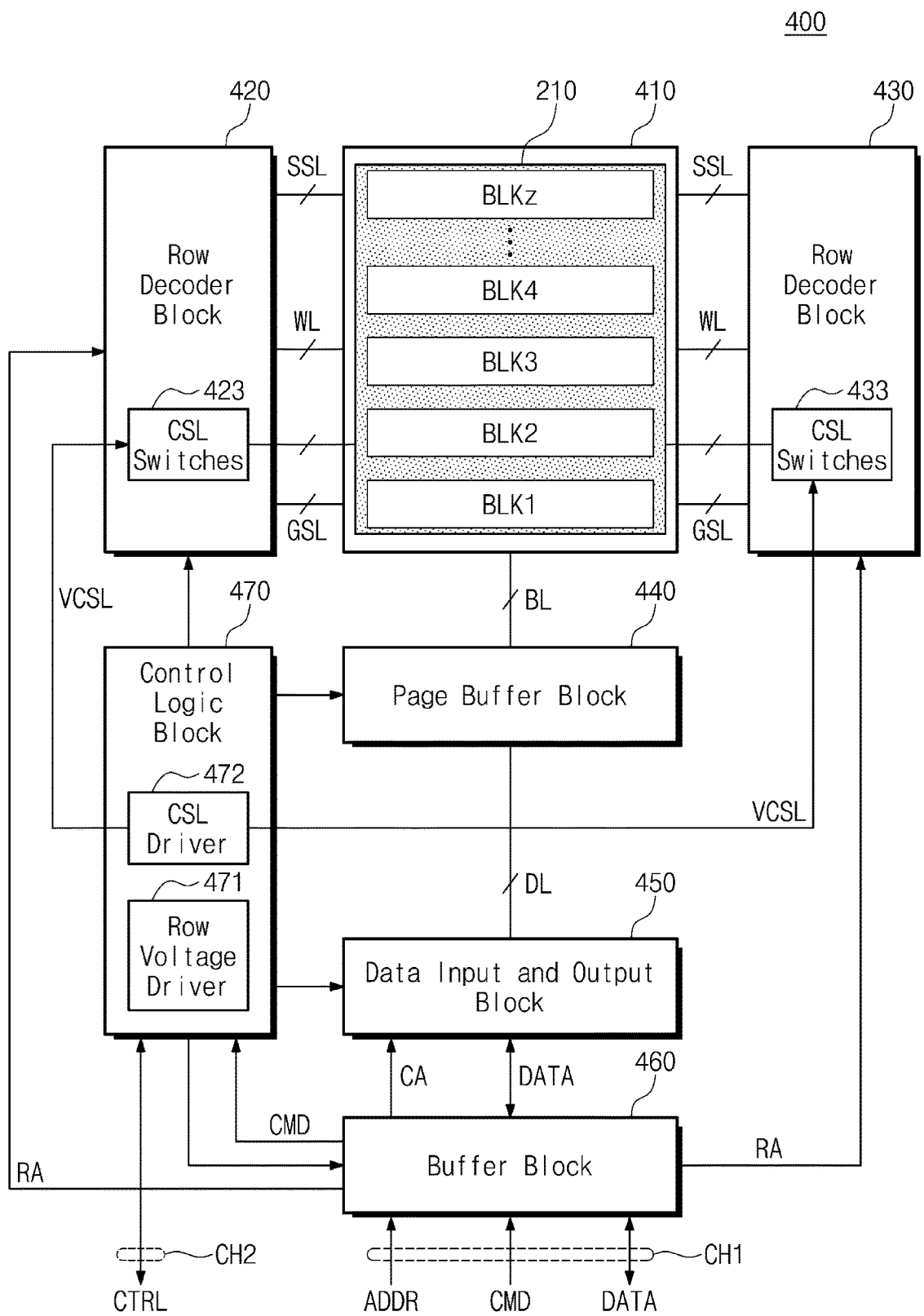
FIG. 9 is a block diagram illustrating a nonvolatile memory device according to an embodiment of the inventive concept.

FIG. 9 is a block diagram illustrating a nonvolatile memory device 400 according to an embodiment of the inventive concept. Referring to FIGS. 1, 2, 3, and 9, the nonvolatile memory device 400 includes a memory cell array 410, a first row decoder block 420, a second row decoder block 430, a page buffer block 440, a data input and output block 450, a buffer block 460, and a control logic block 470.

The memory cell array 410 includes a plurality of memory blocks BLK1 to BLKz on the common source plate 210. Each of the memory blocks BLK1 to BLKz includes one cell structure 220. Each cell structure 220 includes a plurality of memory cells. The memory cell array 410 may be implemented with the memory cell area 200.

Each of the memory blocks BLK1 to BLKz may be connected with the first row decoder block 420 and the second row decoder block 430 through at least one or more ground selection lines GSL, word lines WL, and at least one or more string selection lines SSL.

Some of the word lines WL may be used as dummy word lines. Each of the memory blocks BLK1 to BLKz may be connected with the page buffer block 440 through a plurality of bit lines BL. The plurality of memory blocks BLK1 to BLKz may be connected in common with the plurality of bit lines BL.

The first row decoder block 420 is connected to the memory cell array 410 through the ground selection lines GSL, the word lines WL, and the string selection lines SSL. The first row decoder block 420 operates under control of the control logic block 470.

The second row decoder block 430 is connected with the memory cell array 410 through the ground selection lines GSL, the word lines WL, and the string selection lines SSL. The second row decoder block 430 operates under control of the control logic block 470.

Each of the first and second row decoder blocks 420 and 430 may decode a row address RA received from the buffer block 460 and may control voltages to be applied to the string selection lines SSL, the word lines WL, and the ground selection lines GSL based on the decoded row address.

The first row decoder block 420 may include first common source line switches 423. The first common source line switches 423 may bias voltages to the common source plate 210. The second row decoder block 430 may include second common source line switches 433. The second common source line switches 433 may bias voltages to the common source plate 210.

The first common source line switches 423 may correspond to one of the third transistor 180 and the fourth transistor 190 described with reference to FIG. 6, and the second common source line switches 433 may correspond to the other of the third transistor 180 and the fourth transistor 190 described with reference to FIG. 6.

The page buffer block 440 is connected with the memory cell array 410 through the plurality of bit lines BL. The page buffer block 440 is connected with the data input and output block 450 through a plurality of data lines DL. The page buffer block 440 operates under control of the control logic block 470.

During a write operation, the page buffer block 440 may store data to be written to memory cells. The page buffer block 440 may apply voltages to the plurality of bit lines BL based on the stored data. During a read operation or during a verify read operation performed as part of a write operation or an erase operation, the page buffer block 440 may sense voltages of the bit lines BL and may store the sensing result.

The data input and output block 450 is connected with the page buffer block 440 through the plurality of data lines DL. The data input and output block 450 may receive a column address CA from the buffer block 460. The data input and output block 450 may output data read by the page buffer block 440 to the buffer block 460 depending on the column address CA. The data input and output block 450 may provide data received from the buffer block 460 to the page buffer block 440, based on the column address CA.

The buffer block 460 may receive a command CMD and an address ADDR from an external device through a first channel CH1 and may exchange data "DATA" with the external device. The buffer block 460 may operate under control of the control logic block 470. The buffer block 460 may transmit the command CMD to the control logic block 470. The buffer block 460 may transmit the row address RA of the address ADDR to the row decoder block 420 and the row decoder block 430 and may transmit the column address CA of the address ADDR to the data input and output block 450. The buffer block 460 may exchange the data "DATA" with the data input and output block 450.

The control logic block 470 may exchange a control signal CTRL from the external device through a second channel CH2. The control logic block 470 may allow the buffer block 460 to route the command CMD, the address ADDR, and the data "DATA". The control logic block 470 may decode the command CMD received from the buffer block 460 and may control the nonvolatile memory device 400 depending on the decoded command.

In an embodiment, the first row decoder block 420, the second row decoder block 430, the page buffer block 440, the data input and output block 450, the buffer block 460, and the control logic block 470 may be implemented in the peripheral circuit area 100.

The first row decoder block 420 or at least a part of the first row decoder block 420 may be implemented in the first exposed area 120. The second row decoder block 430 or at least a part of the second row decoder block 430 may be implemented in the second exposed area 130. The buffer block 460 or at least a part of the buffer block 460 may be implemented in the third exposure area 140.

The control logic block 470 may include a row voltage driver 471 and a common source line (CSL) driver 472. The row voltage driver 471 may generate various voltages to be applied to the string selection lines SSL, the word lines WL, and the ground selection lines GSL and may provide the generates voltages to the first row decoder block 420 and the second row decoder block 430.

The common source line driver 472 may generate various common source line voltages VCSL to be applied to the common source plate 210 and may provide the generated common source line voltages VCSL to first common source line switches 423 and second common source line switches 433.

Figure 10:
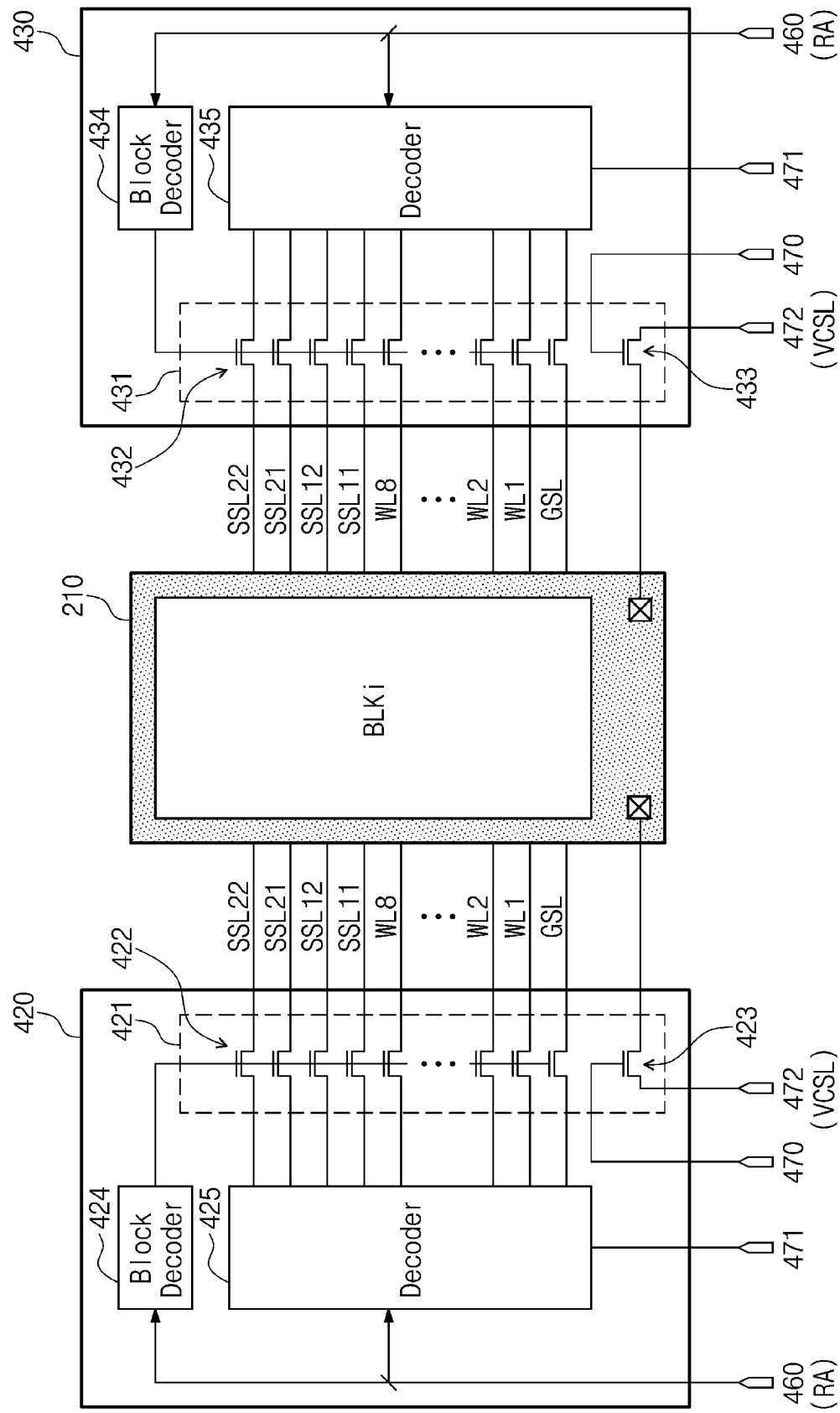
FIG. 10 further illustrates components of a first row decoder and a second row decoder corresponding to one memory block.

FIG. 10 is a block diagram further illustrating the first row decoder block 420 and the second row decoder block 430 of FIG. 9 in relation a memory block BLKi. Referring to FIGS.

1, 2, 3, 8, 9, and 10, the first row decoder block 420 may include a transistor array 421, a block decoder 424, and a decoder 425.

The transistor array 421 may include a plurality of transistors. Transistors, which are connected with the ground selection line GSL, the first to eighth word lines WL1 to WL8, and the string selection lines SSL11, SSL12, SSL21, and SSL22, from among the plurality of transistors may be pass transistors 422.

The pass transistors 422 may be turned ON/OFF simultaneously under control of the block decoder 424. Each of the pass transistors 422 may transfer a voltage output from the decoder 425 to the memory block BLKi through a corresponding line.

A transistor(s), which transfers a voltage to the common source plate 210, from among the plurality of transistors is the common source line switch 423. The common source line switch 423 may be turned ON/OFF under control of the control logic block 470. The common source line switch 423 may apply the common source line voltages VCSL received from the common source line driver 472 of the control logic block 470 to the common source plate 210.

The block decoder 424 may receive a block address, which indicates the memory block BLKi, of the row address RA from the buffer block 460. When the block address indicates the memory block BLKi, the block decoder 424 may turned ON the pass transistors 422. When the block address does not indicate the memory block BLKi, the block decoder 424 may turned OFF the pass transistors 422.

The decoder 425 may receive a ground selection line voltage, a word line selection voltage, word line non-selection voltages, string selection voltages, and string non-selection voltages from the row voltage driver 471 of the control logic block 470. Also, the decoder 425 may receive the remaining address of the row address RA other than the block address from the buffer block 460.

The decoder 425 may apply the ground selection line voltage to the pass transistors 422 connected with the ground selection line GSL. The decoder 425 may apply a selection voltage to the pass transistor 422 connected with a word line indicated by the remaining address from among the word lines WL1 to WL8 and may apply non-selection voltages to the pass transistors 422 connected with the remaining word lines.

The decoder 425 may apply the string selection voltages to the pass transistors 422 connected with string selection lines indicated by the remaining address from among the string selection lines SSL11, SSL12, SSL21, and SSL22. The decoder 425 may apply the string non-selection voltages to the pass transistors 422 connected with string selection lines not indicated by the remaining address from among the string selection lines SSL11, SSL12, SSL21, and SSL22.

The second row decoder block 430 may include a transistor array 431, a block decoder 434, and a decoder 435. The transistor array 431 may include pass transistors 432 and the common source line switch 433. A structure and an operation of the second row decoder block 430 may be the same as the structure and the operation of the first row decoder block 420.

The first row decoder block 420 and the second row decoder block 430 may be disposed in the first exposed area 120 and the second exposed area 130, respectively. For another example, at least a portion of the first row decoder block 420 and the second row decoder block 430, for example, the transistor arrays 421 and 431 may be disposed in the first exposed area 120 and the second exposed area 130, respectively.

The common source line driver 472 that applies the common source line voltages VCSL to the common source plate 210 through the common source line switches 423 and 433 may be disposed in the buried area 110. As the common source line switches 423 and 433 are densely disposed together with the pass transistors 422 and 432, the common source line switches 423 and 433 may be described as a portion of the first row decoder block 420 and the second row decoder block 430. However, the common source line switches 423 and 433 may be understood as components independent of the first row decoder block 420 and the second row decoder block 430.

Figure 11:
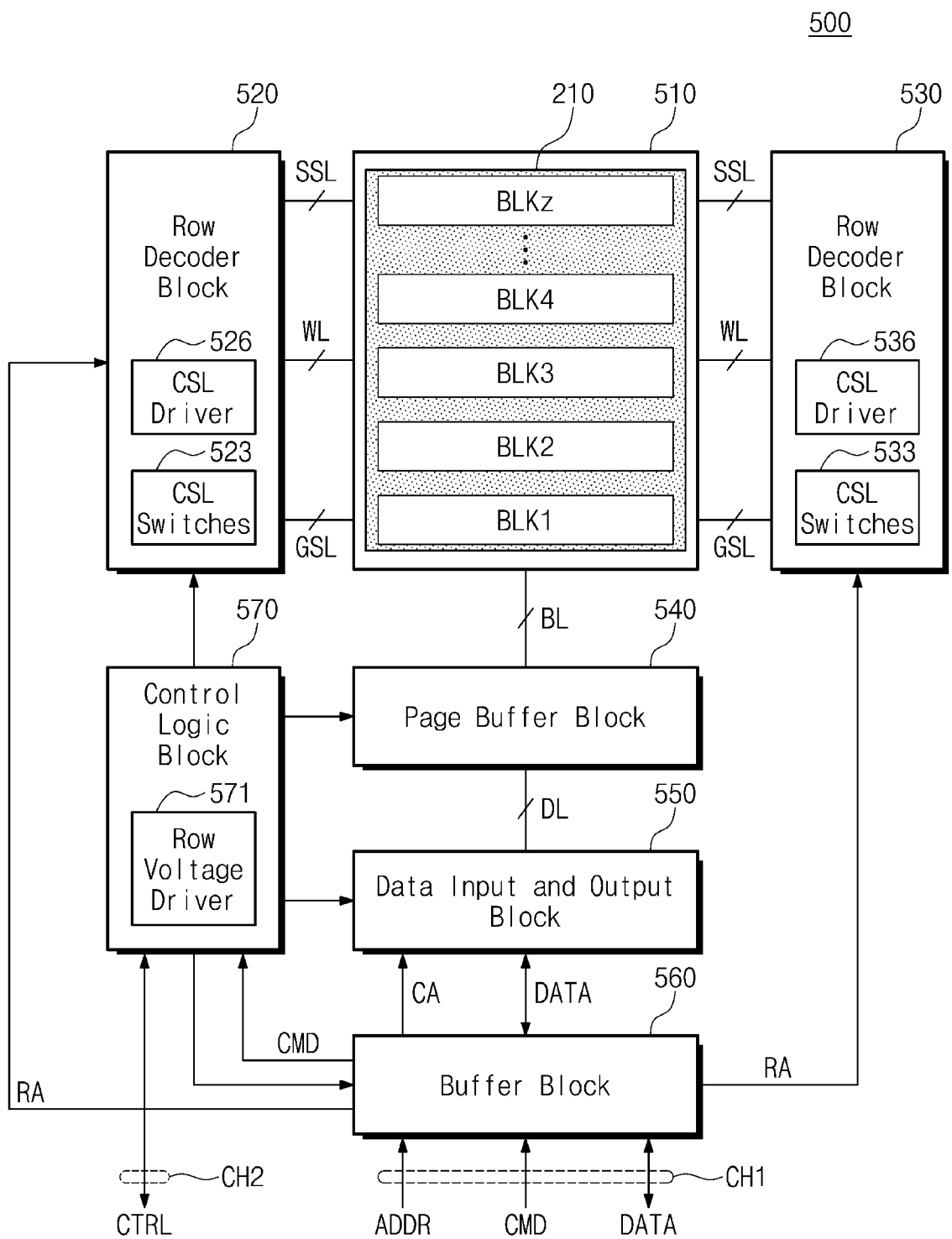
FIG. 11 is a block diagram illustrating a nonvolatile memory device according to another embodiment.

FIG. 11 is a block diagram illustrating a nonvolatile memory device 500 according to another embodiment of the inventive concept. Referring to FIGS. 1, 2, 3, and 11, the nonvolatile memory device 500 includes a memory cell array 510, a first row decoder block 520, a second row decoder block 530, a page buffer block 540, a data input and output block 550, a buffer block 560, and a control logic block 570.

The first row decoder block 520 may include common source line switches 523 and a common source line driver 526. The second row decoder block 530 may include common source line switches 533 and a common source line driver 536. The control logic block 570 may include a row voltage driver 571.

A structure and an operation of the nonvolatile memory device 500 may be the same as the structure and the operation of the nonvolatile memory device 400 of FIG. 9, except that the common source line drivers 526 and 536 are respectively disposed in the first and second row decoder blocks 520 and 530.

Figure 12:
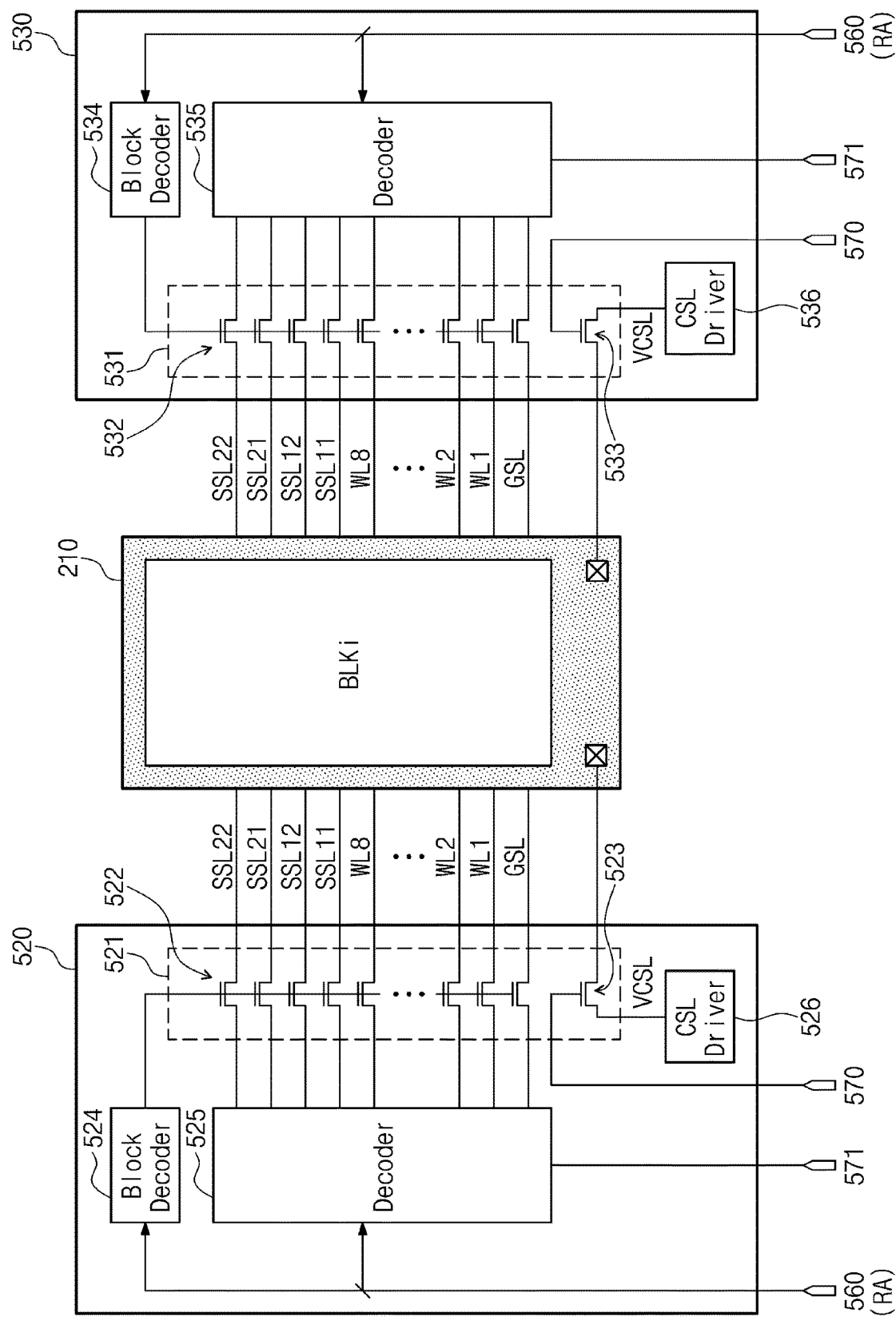
FIG. 12 further illustrates components of a first row decoder block and a second row decoder block corresponding to one memory block.

FIG. 12 illustrates some of components of the first row decoder block 520 and the second row decoder block 530 corresponding to one memory block BLKi. Referring to FIGS. 1, 2, 3, 8, 11, and 12, the first row decoder block 520 may include a transistor array 521, a block decoder 524, a decoder 525, and a common source line driver 526.

The transistor array 521 may include pass transistors 522 and the common source line switch 523. A structure and an operation of the first row decoder block 520 may be the same as the structure and the operation of the first row decoder block 420 described with reference to FIG. 8, except that the common source line driver 526 is added.

The second row decoder block 530 may include a transistor array 531, a block decoder 534, a decoder 535, and the common source line driver 536. The transistor array 531 may include pass transistors 532 and the common source line switch 533. A structure and an operation of the second row decoder block 530 may be the same as the structure and the operation of the first row decoder block 520.

The first row decoder block 520 and the second row decoder block 530 may be disposed in the first exposed area 120 and the second exposed area 130, respectively. In particular, the transistor arrays 521 and 531 and the common source line drivers 526 and 536 may be disposed in the first exposed area 120 and the second exposed area 130, respectively.

In the above embodiments, elements of illustrated embodiments concept are described in differentiating terms, such as "first", "second", etc. Those skilled in the art will recognize that such terms are used for descriptive clarity and not for specific enumeration.

In the above embodiments, certain element are described as "blocks." Such blocks may be variously implemented as hardware devices, (e.g., integrated circuits, application specific ICs (ASCI), field programmable gate arrays (FPGA), and complex programmable logic devices (CPLD)), firmware driven by hardware devices, software (e.g., application(s)), and/or combinations of hardware and software. Various blocks may include circuits implemented with semiconductor elements in an integrated circuit or circuits enrolled as intellectual property (IP).

According to embodiments of the inventive concept, a common source plate functioning as a common source line may be biased using certain vias disposed outside a channel area. As such, it is possible to prevent the voltages being transmitted by the common source plate from adversely affecting signal performance in the channel area. Accordingly, nonvolatile memory devices according to the inventive concept provide improved reliability.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A nonvolatile memory device comprising:
   a memory cell area including at least one cell structure and a common source plate;
   a peripheral circuit area on which the memory cell area is mounted, including a buried area covered by the memory cell area and a first exposed area uncovered by the memory cell area;
   a first peripheral circuit (PC) via extending from the first exposed area; and
   a first common source (CS) via extending from the common source plate,
   wherein the first PC via and the first CS via are connected by a first wire disposed outside the at least one cell structure that provides a bias voltage to the common source plate.

2. The nonvolatile memory device of claim 1, wherein the buried area is centrally disposed on the peripheral circuit area, and
   the peripheral circuit area further includes a second exposed area uncovered by the memory cell area, wherein the first exposed area and the second exposed area are disposed on opposing sides of the buried area.

3. The nonvolatile memory device of claim 2, further comprising:
   a first wiring area above the first exposed area; and
   a plurality of first wires, including the first wire, respectively extending from a plurality of first PC vias, including the first PC via, to connect a plurality of first memory cell (MC) vias extending from the at least one cell structure.

4. The nonvolatile memory device of claim 3, further comprising:
   a second wiring area above the second exposed area; and
   a plurality of second wires respectively extending from a plurality of second PC vias to connect a plurality of second MC vias extending from the at least one cell structure.

5. The nonvolatile memory device of claim 2, wherein the peripheral circuit area further includes a third exposed area uncovered by the memory cell area, wherein the third exposed area extends in a first direction, and the first exposed area and the second exposed area extend in a second direction perpendicular to the first direction.

6. The nonvolatile memory device of claim 5, wherein the third exposed area include circuits configured to communicate with an external device.

7. The nonvolatile memory device of claim 1, wherein the common source plate is disposed between the at least one cell structure and the buried area.

8. The nonvolatile memory device of claim 7, wherein the at least one cell structure comprises multiple cell structures spaced apart on the common source plate and separated by respective word line cuts.

9. A nonvolatile memory device comprising:
   a memory cell area including a cell structure and a common source plate, and mounted on a peripheral circuit area including a buried area covered by the memory cell area and an exposed area uncovered by the memory cell area;
   a first peripheral circuit (PC) via extending from the exposed area; and
   a common source (CS) via extending from the common source plate,
   wherein the first PC via and the CS via are connected by a CS wire disposed outside the cell structure and providing a bias voltage to the common source plate.

10. The nonvolatile memory device of claim 9, further comprising:
    a connection element disposed in an active portion of the peripheral circuit area including a first junction connected to a second PC via that connects a high voltage and a second junction that connects the first PC via.

11. The nonvolatile memory device of claim 9, further comprising:
    a wiring area above the exposed area; and
    a plurality of wires, including the CS wire, respectively extending from PC vias extending from the exposed area to connect memory cell (MC) vias extending from the cell structure.

12. The nonvolatile memory device of claim 11, wherein the cell structure comprises an alternating, vertically stacked arrangement of conductive layers and insulating layers.

13. The nonvolatile memory device of claim 12, wherein the alternating, vertically stacked arrangement of the conductive layers and the insulating layers are arranged in a stair-stepped structure.

14. The nonvolatile memory device of claim 11, wherein the cell structure comprises an alternating, vertically stacked arrangement of conductive layers and insulating layers that form a stair-stepped structure,
    the conductive layers include a third layer disposed on a second layer including an exposed portion of the second layer uncovered by the third layer, and the second layer is disposed on a first layer including an exposed portion of the first layer uncovered by the second layer, and
    the plurality of wires further includes a first wire extending from a first PC via from the PC vias to connect a first MC via from the MC vias extending from the exposed portion of the first layer, and a second wire extending from a second PC via from the PC vias to connect a second MC via from the MC vias extending from the exposed portion of the second layer.

15. A nonvolatile memory device comprising:
    a memory cell array including a plurality of cell strings disposed on a common source plate; and
    a peripheral circuit having an upper surface on which the memory cell array is mounted,
    wherein the peripheral circuit includes:
    a first row decoder having a first upper surface uncovered by the memory cell array, and configured to bias the plurality of cell strings through first wires extending upward from the first upper surface;

a second row decoder having a second upper surface uncovered by the memory cell array, and configured to bias the plurality of cell strings through second wires extending upward from the second upper surface;

first common source switches having a third upper surface uncovered by the memory cell array, and configured to bias the common source plate through third wires extending upward from the third upper surface; and second common source switches having a fourth upper surface uncovered by the memory cell array, and configured to bias the common source plate through fourth wires extending upward from the fourth upper surface.

16. The nonvolatile memory device of claim 15, further comprising:

a page buffer having a fifth upper surface covered by the memory cell array and connected to the plurality of cell strings through vias penetrating the memory cell array.

17. The nonvolatile memory device of claim 15, further comprising:

control logic having a fifth upper surface covered by the memory cell array, and configured to control the first row decoder, the second row decoder, the first common source switches, and the second common source switches.

18. The nonvolatile memory device of claim 15, further comprising:

a buffer having a fifth upper surface uncovered by the memory cell array, and configured to communicate with an external device.

19. The nonvolatile memory device of claim 15, wherein the memory cell array is a three-dimensional memory cell array including a plurality of vertical channels extending downwardly through a cell structure including the plurality of cell strings.

20. The nonvolatile memory device of claim 19, wherein each one of the plurality of vertical channels connects a vertical stack of cell transistors including at least one of memory cell transistors, dummy memory cell transistors, and selection transistors.

* * * * *